(12) United States Patent
Vanderheyden et al.

(10) Patent No.: US 6,853,548 B2
(45) Date of Patent: Feb. 8, 2005

(54) 1U RACK MOUNT EQUIPMENT ENCLOSURE WITH INCREASED STRUCTURAL SUPPORT

(75) Inventors: William J. Vanderheyden, Loveland, CO (US); Kevin Sean Fletcher, Boulder, CO (US); David T. Hoge, Westminister, CO (US); Steven F. Hartung, Boulder, CO (US)

(73) Assignee: Quantum Corporation, San Jose, CA (US)

( * ) Notice: Subject to any disclaimer, the term of this patent is extended or adjusted under 35 U.S.C. 154(b) by 209 days.

(21) Appl. No.: 10/335,730

(22) Filed: Jan. 2, 2003

(65) Prior Publication Data

US 2004/0130865 A1 Jul. 8, 2004

(51) Int. Cl.[7] ................................................. G06F 1/16
(52) U.S. Cl. ....................................................... 361/685
(58) Field of Search ................................. 361/683–686, 361/724–727; 360/97.01, 98.01, 137, 137 D; 211/71.01, 83; 248/636, 638; 312/223.1, 223.2, 223.3, 334.44

(56) References Cited

U.S. PATENT DOCUMENTS

| | | | |
|---|---|---|---|
| 4,979,909 A | | 12/1990 | Andrews |
| 5,124,886 A | * | 6/1992 | Golobay ..................... 361/727 |
| 5,262,923 A | | 11/1993 | Batta et al. |
| 5,301,088 A | | 4/1994 | Liu |
| 5,309,323 A | * | 5/1994 | Gray et al. ................. 361/726 |
| 5,340,340 A | | 8/1994 | Hastings et al. |
| 5,503,472 A | * | 4/1996 | Vu et al. .................. 312/223.2 |
| 5,506,750 A | * | 4/1996 | Carteau et al. ............. 361/685 |
| 5,768,099 A | | 6/1998 | Radloff et al. |
| 5,788,211 A | | 8/1998 | Astier |
| 6,154,361 A | * | 11/2000 | Anderson et al. .......... 361/685 |
| 6,299,266 B1 | | 10/2001 | Justice et al. |
| 6,392,884 B1 | * | 5/2002 | Chou ......................... 361/687 |
| 6,612,667 B2 | * | 9/2003 | Tsai et al. ................ 312/223.1 |
| 6,653,802 B1 | * | 11/2003 | Nelson et al. ............. 361/725 |
| 2002/0181197 A1 | * | 12/2002 | Huang ....................... 361/685 |
| 2003/0112596 A1 | * | 6/2003 | Shih .......................... 361/685 |

* cited by examiner

*Primary Examiner*—Lisa Lea-Edmonds
(74) *Attorney, Agent, or Firm*—Patton Boggs LLP

(57) ABSTRACT

The 1U rack mount equipment enclosure with increased structural support, supports internal components without adding to the over all height of the 1U form factor. The peripheral device is mounted between front supports which bear the weight of the peripheral device. A central support provides support necessary to prevent deflection of the front supports. Rear supports between the central support and the rear side provide support to prevent the central support from bending due to the force placed on the central support by the front supports.

9 Claims, 4 Drawing Sheets

1U RACK MOUNT EQUIPMENT ENCLOSURE WITH INCREASED STRUCTURAL SUPPORT

FIELD OF THE INVENTION

The invention relates to rack mountable enclosures, and in particular to a rack mountable enclosure having a 1U form factor.

Problem

It is a problem in the field of rack mountable enclosures to provide an enclosure fitting within a 1U form factor while also providing an equipment enclosure that encloses equipment that is substantially 1U in height. Modern computer systems and computer-operated equipment may incorporate one or more peripheral devices, such as mass storage devices, mounted to the chassis within the equipment enclosure. These peripheral devices are typically removable for replacement, repair, or other purpose. A wide variety of different components is used to enable mounting/removal of the devices. For example, in certain systems the peripheral devices are physically secured in position by using screws or other conventional fasteners requiring tools for removal or replacement, which make installation and removal time-consuming and cumbersome.

Mounting Rail Systems

Other mounting systems for computer peripheral devices consist of low cost mounting systems requiring tools to attached rail systems or brackets. One such device comprises two flat rectangular sidepieces that are attached to opposing sides of the peripheral device. Receiving rails are provided in the area of the chassis where the peripheral device is to be mounted, and are adapted to cooperate with the sidepieces in a sliding arrangement. Examples of this type of mounting can be found, for instance, in U.S. Pat. No. 4,979,909 and in U.S. Pat. No. 5,262,923. U.S. Pat. No. 5,768,099 describes use of a generally U-shaped bracket to which a peripheral device is screwed. The bracket is then mountable within the computer system without the use of screws. However, when the peripheral device is replaced, the replacement tape drive must have side rails or U-shaped members corresponding to the computer system rail system or the U-shaped bracket must be removed from the failed device and attached to the replacement device. Another problem with the U-shaped bracket arrangement is that the mounting hardware adds width or height to the computer system in which the peripheral device is mounted.

Mounting Tray

Other designs focus on an easily removable tray or bracket which contains the peripheral device. In most cases, a tray design also requires tools to mount the peripheral in the tray. Tray designs also add height to the computer system. Examples can be found in U.S. Pat. No. 5,301,088, U.S. Pat. No. 5,340,340, U.S. Pat. No. 577,788,211 and U.S. Pat. No. 5,768,099. Another mounting system uses a tray in combination with clips, or spring-actuated pins, to hold a peripheral device in place as described in the Justice tray design (U.S. Pat. No. 6,299,266). Since the removable tray and the U-shaped bracket designs add height to the computer system, computer systems incorporating these designs often are not available in slim profile packaging.

The height of the computer peripheral mounted within the equipment enclosure conforms to the 5.25-inch half-height form factor specification which nearly equals the space available for the 1U form factor for the rack mounted equipment enclosure. For instance, a half-height 5.25 form factor peripheral device specifies a maximum height of 1.65 inches. A 1U form factor equipment enclosure is 1.750 inches, therefore leaving only a fraction of space, 0.10 inch, for the equipment enclosure top cover and bottom cover, and to provide a tolerance for sagging of the assembled equipment enclosure. The effect sagging has on the overall height of the equipment enclosure is, in part, dependent on the weight and placement of equipment within the enclosure. The rack, telescopic sides and the equipment enclosure add to the tolerance totaling roughly 0.05 inches, leaving a tolerance of 0.05 inches for sag in the assembled equipment enclosure.

A typical equipment enclosure consists of a sheet-metal enclosure with mounting points for mounting the peripheral devices, power supplies and other necessary components. However, a typical equipment enclosure does not provide the structural rigidity required for mounting two mass storage devices. Decreasing the thickness of the sheet metal used for the top cover and the bottom of the equipment enclosure reduces the overall height at the expense of increasing the sag of the equipment enclosure. Therefore, decreasing the thickness of the sheet metal alone is not a satisfactory solution to the problem since an equipment enclosure that is not strong enough to maintain structural rigidity will deflect, or sag, breaching the form factor specification requirements for a 1U form factor equipment enclosure. Increasing the thickness of the sheet metal slightly does not sufficiently reduce the sag, also resulting in an equipment enclosure that does meet the 1U form factor requirements.

For these reasons, a need exists for a 1U form factor equipment enclosure having a decreased overall height and a rigidity that decreases the sag resulting form the weight of the components mounted within the equipment enclosure.

Solution

The 1U rack mount equipment enclosure provides a structural support for mounting half-high devices while meeting the maximum height requirements for the 1U form factor. Equipment enclosure includes a left and right sidewall, a rear sidewall and a bottom cover. The structural support which gives the 1U rack mountable equipment enclosure the rigidity required to meet the 1U specifications include a central support beam, two front supports cantilevered from the central support beam to the front plane of the enclosure, and two rear supports extending between central support beam and the rear sidewall. Left and right side brackets are secured to left and right sidewalls of equipment enclosure between the central support beam and the front plane. One peripheral device is mounted between the left side bracket and left front support while the other peripheral device is mounted between the right front support and the right side bracket.

DETAILED DESCRIPTION

The 1U rack mountable equipment enclosure summarized above and defined by the enumerated claims may be better understood by referring to the following detailed description, which should be read in conjunction with the accompanying drawings. This detailed description of the preferred embodiment is not intended to limit the enumerated claims, but to serve as a particular example thereof. In addition, the phraseology and terminology employed herein is for the purpose of description, and not of limitation.

Figure 1:
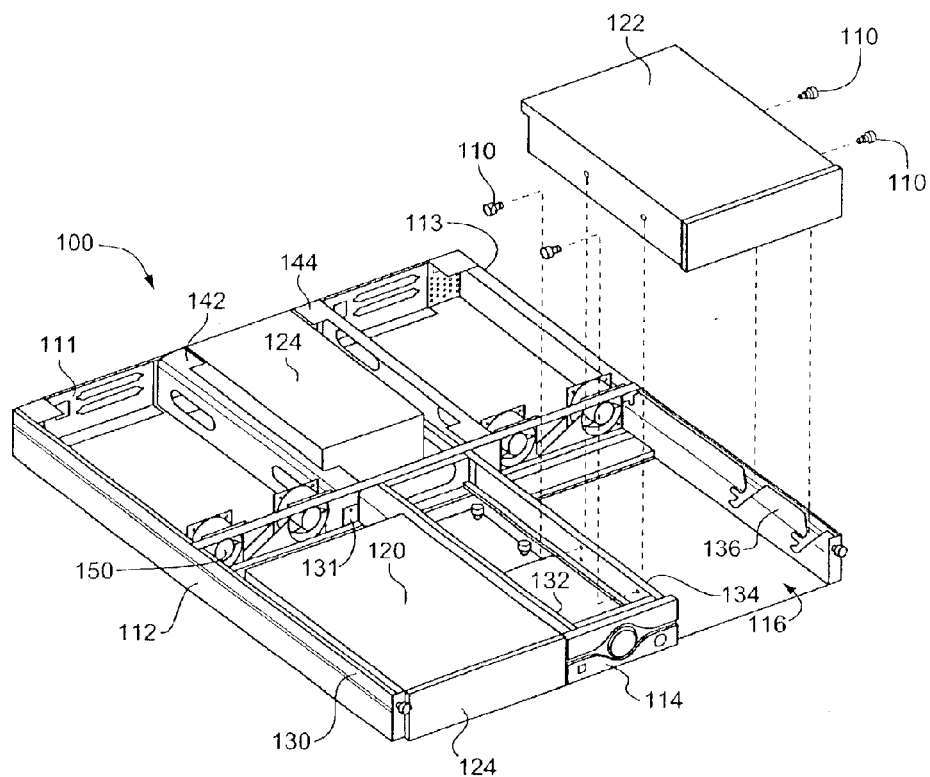
FIG. 1 illustrates a top perspective view of the present 1U rack mountable equipment enclosure with increased structural support for installing two single reel tape drives in a dual tape drive enclosure.

A dual tape drive incorporating the present 1U rack mountable equipment enclosure with increased structural support is illustrated in FIG. 1. Equipment enclosure 100 comprises a left and right sidewall 112 and 113 respectively, a rear sidewall 111 and a bottom cover 116. The structural support which gives the 1U rack mountable equipment enclosure the rigidity required to meet the 1U specifications includes a central support beam 150, two front supports 132 and 134 cantilevered from the central support beam 150 to the front plane of the enclosure, and two rear supports extending between central support beam 150 and the rear sidewall 111. Left and right side brackets 130 and 136 are secured to left and right sidewalls 112 and 113 of equipment enclosure 100 between the central support beam and the front plane. A combination of one side bracket and one front support secure a peripheral device within the equipment enclosure. For example, peripheral device 122 is mounted between right side bracket 136 and front support 134 while peripheral device 120 is mounted between left side bracket 130 and front support 132.

The computer equipment illustrated and described is a rack mounted dual tape drive device although alternative configurations and uses may be substituted. Still referring to FIG. 1, peripheral devices 120 and 122, single reel tape drives in this example, are mounted within equipment enclosure 100 with the height of peripheral devices 120 and 122 approximately the same height as the equipment enclosure 100 into which peripheral devices 120 and 122 are mounted. In other words, the form factor of equipment enclosure 100 and peripheral devices 120 and 122 installed therein are substantially the same. The "form factor" refers generally to the peripheral dimensions of the equipment enclosure and the tape drives. In this example, the equipment enclosure 100 is an industry standard 1U form factor having a maximum height of 1.750 inches. The specification for a half-high form factor single reel tape cartridge specifies a maximum height of 1.650 inches. Therefore, the vertical height within equipment enclosure 100 for mounting the dual peripheral devices 120 and 122 is only 0.100 inches.

Structural Support:

Providing a structural support wherein the peripheral device is secured from the sides of the peripheral device instead of the top and bottom reduces the overall height required for the dual tape drive and the internal structural support provides the rigidity required to support the fully assembled equipment enclosure 100 that meets the industry standard 1U form factor. The structural support also solves the problem of sagging of the assembled dual tape drive.

Figure 2:
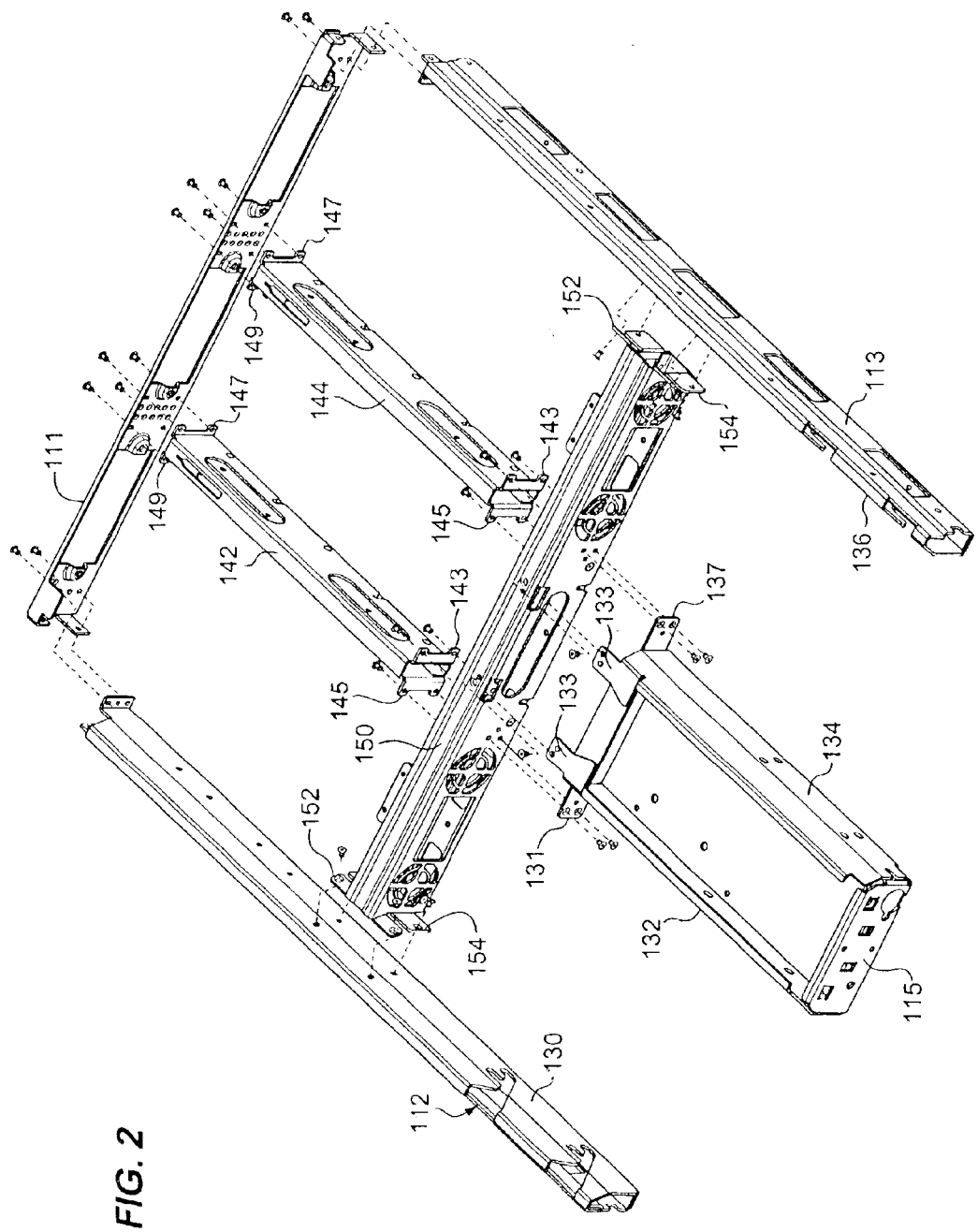
FIG. 2 illustrates an exploded view of the structural support in accordance with the present 1U rack mount equipment enclosure with increased structural support.

The structural support illustrated in FIG. 2 supports the weight of the dual tape drives with front supports 132 and 134 which are each used to secure one side of the corresponding dual tape drives 120 and 122 with the other side of the dual tape drives inserted into slots in left and right side brackets 132 and 136 as illustrated in the exploded view of FIG. 1. The front supports 132 and 134 are cantilevered from a central support beam 150 and are located adjacent to dual tape drives 120 and 122 for installation of dual tape drive 120 and 122. When the present 1U rack mountable equipment enclosure with increased structural support is used for dual tape drives, the front sidewall of the enclosure is substantially open to provide access for inserting and extracting tape cartridges from the dual tape drives. A partial front panel is located between the front bezels of the dual tape drives to provide a continuous front panel and may be used for operational components such as switches, indicator lights and name plates. In this configuration, front panel 114 provides little support for front supports 132.

Fasteners 110 are used to attach tape drives 120 and 122 to front supports 132 and 134 and side brackets 130 and 136 as illustrated by the dashed lines in FIG. 1. The weight of the tape drives is shared by the right and left side brackets 130 and 136 that are attached to right and left sidewalls 112 and 113 of equipment enclosure 100 and front supports 132 and 134, therefore reducing the weight applied to bottom cover 116 of the equipment enclosure to reduce sagging of the bottom cover 116. Lack of a rigid front sidewall increases the support required by front supports 132 and 134 from central support beam 150.

Central Support:

Central support beam 150 provides support for the left and right front supports 132 and 134 and therefore requires a sufficient rigidity to prevent central support beam 150 from flexing forward. FIG. 2 illustrates central support beam 150 located substantially central within the equipment enclosure and extending between left and right sides 111 and 113 respectively. The location and the rigidity required for central support beam 150 is at least partially dependent on the support required by front supports 132 and 134 and on the size and location of components located within equipment enclosure 100. Central support beam 150 may be a single support beam or may be configured to provide additional rigidity to the support structure.

Central support beam 150 may be a U-shaped support with the open end of the U-shaped support against bottom cover 116 of equipment enclosure 100. In this configuration, a bottom U-shaped channel may be attached to bottom cover 116 with the open end of the second U-shaped channel (not shown) oriented upward. The interior dimension of the two U-shaped channels is selected such that when bottom U-shaped channel is connected to bottom cover 116, the exterior sides of the bottom U-shaped channel mate with the interior sides of the U-shaped central support. The sides of the U-shaped central support and the sides of the bottom U-shaped channel are connected to attach the U-shaped central support to the bottom cover 116 and to provide additional structural rigidity to the sides of central support beam 150.

As illustrated in FIG. 2, the right and left ends of central support beam 150 may also include front and rear tabs 152 and 154 for connecting the ends of central support 150 to left and right sidewalls 112 and 113 of equipment enclosure 100. Central support beam 150 includes apertures for cables and apertures for forced airflow; however, alternative configurations may be substituted such as a solid central support beam.

Front Supports:

The configuration of the front supports 132 and 134 provide the structural rigidity required for supporting the weight of the dual tape drives. Front supports 132 and 134 may be U-shaped supports with one side of the U-shaped support attached to bottom cover 116 of equipment enclosure 100 wherein the center section of the U-shaped support is adjacent to one side of the dual tape drives for installation. Front supports 132 and 134 may be chamfered to aid in installation of the tape drives as illustrated in FIG. 2.

Referring to the exploded view of front supports 132 and 134 and the central support beam 150 of FIG. 2, front supports 132 and 134 include four mounting tabs for rigidly connecting front supports 132 and 134 to central support beam 150. Left front support 132 includes a left front side tab 131 extending perpendicularly from the center section of left front support 132 toward right sidewall 112. Left front side tab 131 may include mounting holes for attaching the left front support 132 to central support beam 150.

The left front support 132 also includes a left front top mounting tab 133 extending perpendicularly from a top edge of the end of left front support 132 toward the right and parallel with the top of central support beam 150. One end of the left front top-mounting tab 133 connects with left front support 132 and an adjacent side of the left front top-mounting tab 133 attaches with central support beam 150. The left front top mounting tab 133 and left front side mounting tab 131 rigidly attach the left front support 132 with the central support beam 150 to minimize the downward deflection of the of front support 132 when supporting the weight of tape drive 120.

Increasing the complexity of front supports 132 and 134 increases the rigidity of supports 132 and 134. For example, the left and right front supports may be sides of a box shaped support having a base that provides additional internal thickness to bottom cover 116 of equipment enclosure 100 as illustrated in FIG. 2 without increasing the overall height. The left and right front supports may be folded sides of the box-shaped front support. In this example, a rear side may also be formed with tabs 131 and 137 extensions of the rear side of the box-shaped front support to attach the box-shaped front support to central support beam 150.

Since there is a natural tendency for the left and right front supports to fold downward toward the tape drive it is supporting, an additional top tab 133 and 135 may be used to attach the top of front supports 132 and 134 to central support beam 150. The top tab may be an extension of the top of the front support folded to extend parallel with the top of central support beam 150 for connection with the central support beam 150. In this example, illustrated in FIG. 2, the front top support extends into a slit provided in the U-shaped central support where the top tab is attached with central support 150. Those skilled in the art will appreciate that while the box-shaped front support increases the rigidity of the front supports, the box-shaped front support is an example and that alternative configurations may be substituted.

Rear Supports:

Central support beam 150 provides support for the left and right front supports 132 and 134 and therefore requires a sufficient rigidity to prevent central support beam 150 from flexing forward. As central support beam 150 supports front supports 132 and 134, there is a natural tendency for central support beam 150 to twist due to the downward force on front supports 132 and 134.

Rear supports 142 and 144 are connected between central support beam 150 and rear sidewall 111 to provide support for central support beam 150 to prevent central support beam 150 from twisting as a result of the weight of dual tape drives 120 and 122 supported by front supports 132 and 134 and left and right side brackets 130 and 136. Front supports 132 and 134 are applying a force pulling the central support beam 150 toward the front of the equipment enclosure 100 which would cause central support beam 150 to flex, or bend, toward the front of the equipment enclosure 100, absent rear supports 142 and 144. The rear supports are attached to the rear sidewall 111 to provide support for central support beam 150 to minimize the downward deflection of the central support beam 150.

FIG. 1 illustrates two rear supports 142 and 144 wherein a power supply 124 is mounted in the center rear of the equipment enclosure between the two rear supports 142 and 144. However, the power supply may be mounted on the left or the right rear side of the equipment enclosure since the two rear supports 142 and 144 divide the rear section of the equipment enclosure into substantially equal compartments. This configuration is only one of many possible configurations which may be utilized to enclose a variety of components within the 1U form factor equipment enclosure.

Figure 3:
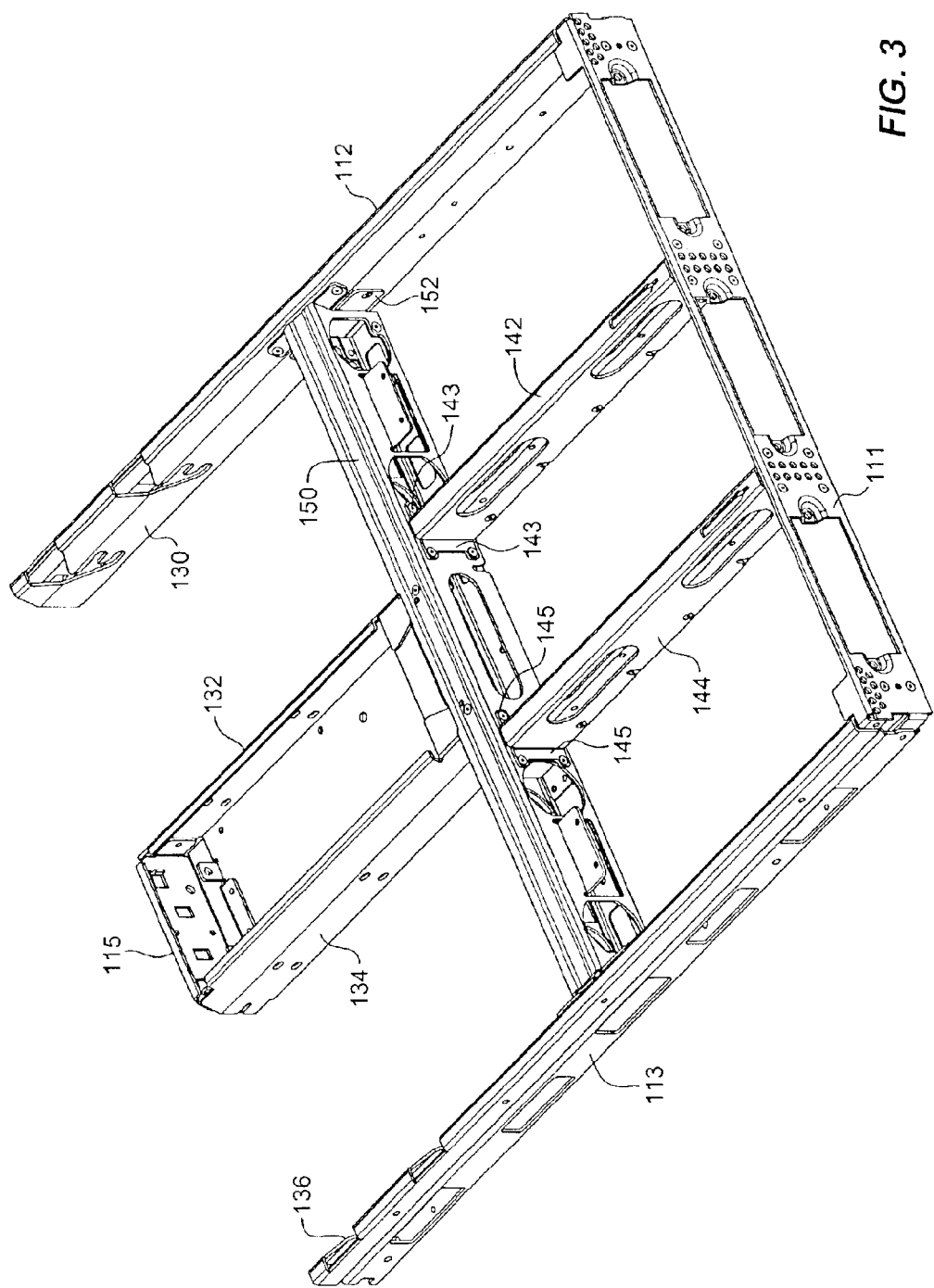
FIG. 3 illustrates a rear perspective view of the structural support in accordance with the present 1U rack mount equipment enclosure with increased structural support.

Based on the support required by central support beam 150, rear supports may be constructed to provide increased rigidity. When increased support is required and space is available, additional rear supports may be included and the rear supports may be arranged to provide the maximum support required by central support beam 150. Similar to the central support beam rigid configuration, a rear support may comprise mating U-shaped channels. In this configuration, center section of the inner U-shaped channel is attached to the bottom cover of the equipment enclosure with the mating U-shaped channel fitting over the inner U-shaped channel. The sides of the mating U-shaped channel are attached to the sides of the inner U-shaped channel to increase the rigidity of the rear support. The rear support also includes left and right tabs 143 and 145 at the ends of the rear support for attaching the rear support to the central support. Referring to FIG. 3, left and right rear tabs 147 and 149 attach the rear supports 142 and 144 to the rear sidewall 111. While the rear supports illustrated include apertures for routing wiring, alternative configurations may be substituted such as solid rear supports.

Figure 4:
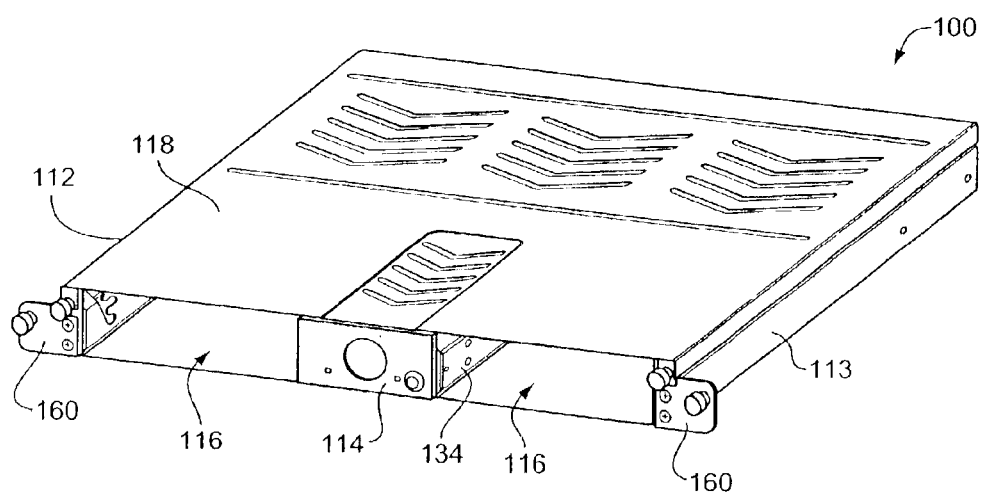
FIG. 4 illustrates a front perspective view of the present 1U rack mountable equipment enclosure with increased structural support.

Bottom and Top Covers:

A perspective view of the assembled 1U form factor rack mountable equipment enclosure is illustrated in FIG. 4. The assembled equipment enclosure includes tabs 160 on the right and left of equipment enclosure 100 for rack mounting. The bottom cover 116, left and right sidewalls, the rear wall, and the front panel 114 may be constructed from a single sheet of sheet metal folded to form a box-shaped bottom of the equipment enclosure. Forming the bottom cover, sidewalls 112 and 113 and rear wall 111 from a single length of sheet metal reduces the overall height of the equipment enclosure 100. The top cover may be hingedly attached to a sidewall. While the structural support provides the rigidity required to support the dual tape drives, the bottom cover 116 of the equipment enclosure is of sufficient thickness to prevent excessive sag in the assembled dual tape drive due to the weight of the dual tape drives and the structural support. To maintain a height that meets the specification for the 1U form factor equipment enclosure, the top cover 118 thickness is less than the thickness of the bottom cover, together adding approximately 0.040 inches to the overall height, resulting in approximately 0.010 inch for sag in the bottom cover 116 of the fully assembled 1U form factor rack mountable equipment enclosure 100.

Top cover 118 is removable and attaches to section of the front panel with thumbscrews to prevent adding excessive height to the assembled equipment enclosure. To increase the rigidity of the thin sheet metal, the top cover may be embossed, or debossed, with strengthening ridges such as those illustrated in FIG. 3 which resemble sergeant stripes.

The present 1U form factor rack mountable equipment enclosure with increased structural support provides a structural support allowing a half-high form factor storage device having a height up to 1.650 to be rack mounted in an equipment enclosure that meets the 1U form factor height specifications. While the present 1U form factor rack mountable equipment enclosure with increased structural support has been illustrated and described for use with dual tape drives, alternative devices not exceeding 1.650 inches in height may be substituted.

As to alternative embodiments, those skilled in the art will appreciate that the present 1U form factor rack mountable equipment enclosure with increased structural support has been illustrated and described for use in installing tape drives in a dual tape drive device although the equipment enclosure could be used to install alternative peripheral devices in an alternative configuration of the structural support. The structural support may be modified to support an alternative number of components in an alternative configuration and therefore is not limited to inclusion of one central support, two front and two rear supports. As required for the design, structural components may be added or deleted.

It is apparent that there has been described, a 1U form factor rack mountable equipment enclosure with increased structural support that fully satisfies the objects, aims, and advantages set forth above. While the 1U form factor rack mountable equipment enclosure with increased structural support has been described in conjunction with specific embodiments thereof, it is evident that many alternatives, modifications, and/or variations can be devised by those skilled in the art in light of the foregoing description. Accordingly, this description is intended to embrace all such alternatives, modifications and variations as fall within the spirit and scope of the appended claims.

What is claimed is:

1. A one and three-quarter inch form factor rack mountable equipment enclosure comprising:
    a bottom cover having a right sidewall, a left sidewall and a rear sidewall extending perpendicularly upward from said bottom cover;
    a central support beam parallel to said rear wall and connected to said right sidewall, said left sidewall, and said bottom cover;
    a front support cantilevered from said central support extending to a front plane of said equipment enclosure;
    a means for rigidly attaching said front support to said central support beam and said bottom cover;
    a rear support between said central support beam and said rear wall;
    a means for connecting said rear support to said bottom cover, said central support beam and said rear sidewall; and
    a top cover for enclosing top of said equipment enclosure.

2. The equipment enclosure of claim 1 wherein said front support further comprises:
    a right and left mounting tab extending perpendicular from a center section of said front support for attaching said front support to said central support beam; and
    a right and left mounting tab extending outward from a top side of said front support for attaching said front support to said central support beam to increase rigidity between said central support beam and said front support.

3. The equipment enclosure of claim 1 wherein said front support comprises:
    a left and right front support cantilevered from said central support beam; and
    a means for rigidly attaching said left and right front supports to said central support beam to minimize the downward deflection of said left and right front support.

4. The equipment enclosure of claim 3 wherein said means for rigidly attaching comprises:
    a right and left mounting tab extending perpendicular from a center section of said left and right front supports for attaching said left and right front supports to said central support beam; and
    a right and left mounting tab extending outward from a top side of said left and right front supports for attaching said front support to said central support beam to increase rigidity between said central support beam and said left and right front support.

5. The equipment enclosure of claim 1 wherein said front support comprises:
    a left front support for attaching one side of a first device within said equipment enclosure;
    a right front support for attaching one side of a second device within said equipment enclosure; and
    a means for rigidly attaching said left and right front supports to said central support beam to minimize the downward deflection of said left and right front supports.

6. The equipment enclosure of claim 1 wherein said rear support comprises:
    two or more rear supports; and
    a means for rigidly attaching said two or more rear supports to said central support beam.

7. A one and three-quarter inch form factor rack mountable dual storage device comprising:
    a bottom cover having a right sidewall, a left sidewall and a rear sidewall extending perpendicularly upward from said bottom cover;
    a central support beam parallel to said rear sidewall and connected with said right sidewall, said left sidewall, and said bottom cover;
    a right front support cantilevered from said central support beam, wherein said right front support includes a means for mounting one side of a first storage device;
    a left front support cantilevered from said central support beam, wherein said left rear support includes a means for mounting one side of a second storage device;
    a means for rigidly attaching said right front support and said left front support to said central support beam;
    a right and a left mounting bracket connected to said right and said left sidewalls between said central support beam and said front plane for connecting an opposite side of said first and said second storage devices;
    a rear support perpendicular to said central support beam and extending between said central support beam and said rear sidewall;
    a means for connecting said rear support with said bottom cover, said central support beam and said rear sidewall; and
    a top cover for enclosing said equipment enclosure.

8. The dual storage device of claim 7 wherein said rear support beam comprises a left rear support and a right rear support.

9. The dual storage device of claim 7 wherein said means for rigidly attaching said right and said left front support to said central support beam comprises:
    a right tab extending perpendicularly outward from a central section of one end of said right front support for attaching said right front support to said central support beam;
    a left tab extending perpendicularly outward from a central section of one end of said left front support for attaching said left front support to said central support beam;
    a right tab extending perpendicularly outward from a top of said one end of said right front support; and
    a left tab extending perpendicularly outward from a top of said one end of said left front support.

* * * * *